(12) United States Patent
Seo et al.

(10) Patent No.: US 6,190,993 B1
(45) Date of Patent: Feb. 20, 2001

(54) METHOD OF FABRICATING CAPACITOR FOR SEMICONDUCTOR DEVICE

(75) Inventors: Soo Jin Seo; Byung Jae Choi, both of Choongcheongbuk-Do (KR)

(73) Assignee: Hyundai Electronics Industries Co., Ltd., Ichon (KR)

( * ) Notice: Under 35 U.S.C. 154(b), the term of this patent shall be extended for 0 days.

(21) Appl. No.: 09/223,750

(22) Filed: Dec. 31, 1998

(30) Foreign Application Priority Data

Sep. 1, 1998 (KR) .................................................. 98-35875

(51) Int. Cl.⁷ ............................................. H01L 21/8242
(52) U.S. Cl. .................... 438/398; 438/253; 438/254; 438/255; 438/396; 438/397
(58) Field of Search ................................. 438/253, 254, 438/255, 256, 396, 397, 398, 399

(56) References Cited

U.S. PATENT DOCUMENTS 5,354,705 * 10/1994 Matthews et al. ................... 438/397
5,691,228 * 11/1997 Ping et al. ............................ 438/398
5,811,331 * 9/1998 Ying et al. ............................ 438/253
5,915,189 * 6/1999 Sim ....................................... 438/397
5,966,600 * 10/1999 Hong ..................................... 438/253

* cited by examiner

*Primary Examiner*—Carl Whitehead, Jr.
*Assistant Examiner*—Toniae M. Thomas
(74) *Attorney, Agent, or Firm*—Fleshner & Kim, LLP

(57) ABSTRACT

A method for fabricating a capacitor for a semiconductor device is disclosed. The method includes the steps of forming an insulation film having a contact hole on a substrate, forming a hemispherical grain (HSG) film on an inner surface of the contact hole, forming a lower electrode on a surface of the HSG film, removing the insulation film, forming a dimple on a surface of the lower electrode by removing the HSG film, forming a dielectric film on a surface of the lower electrode, and forming an upper electrode on a surface of the dielectric film, for thereby enhancing a reproducibility of the process and a reliability of a semiconductor device by preventing a lower electrode of a capacitor and a HSG film from being damaged.

20 Claims, 4 Drawing Sheets

METHOD OF FABRICATING CAPACITOR FOR SEMICONDUCTOR DEVICE

BACKGROUND OF THE INVENTION

1. Field of the Invention

The present invention relates to a method for fabricating a capacitor for a semiconductor device, and in particular to an improved method for fabricating a capacitor for a semiconductor device which is capable of increasing an effective area of a capacitor by forming a dimple on a lower electrode of the capacitor.

2. Description of the Background Art

A DRAM cell is formed of one transistor and one capacitor. Therefore, in order to increase the integration density of a semiconductor memory device, a study has been intensively conducted for decreasing the area of a capacitor which is a unit device. At an initial stage of the development, the capacitor which was actually utilized for a commercial DRAM was a planer type, in which a dopant layer formed on a semiconductor substrate was used as a lower electrode, including a dielectric film and a conductive film formed on the semiconductor substrate. Recently, a 3-dimensional capacitor formed in a stackable type or trench type is disclosed, which is capable of decreasing the area of a capacitor mounted on a semiconductor device and increasing the capacitance of the capacitor. The above-described 3-dimensional capacitor is widely used.

However, there is a limit for increasing the capacitance using a 3-dimensional capacitor. Namely, in order to decrease the area on the capacitor occupied by the capacitor and increase the capacitance of the capacitor, the height of the capacitor should be increased or a deep trench should be formed on the semiconductor substrate. Therefore, the process may be damaged due to the wiring error during a wiring process, in which the unit devices of the semiconductor device are connected, and the coating problems. In order to overcome the above-described problems, a semicircular silicon film is formed on the surface of the node electrode of the capacitor for thereby forming an embossed portion thereon, so that the effective area of the lower electrode of the capacitor is increased for thereby increasing the capacitance of the capacitor.

The fabrication method of a capacitor using a known HSG film will be explained with reference to FIGS. 1A through 1C. Namely, as shown in FIG. 1A, a plurality of capacitor lower electrodes 3 are formed on the semiconductor substrate 1. The method for forming the lower electrodes 3 of the capacitor will be explained. An insulation film 2 is formed on the semiconductor substrate 1, and the insulation film 2 is selectively etched for thereby exposing the surfaces of the semiconductor substrate 1. Next, a conductive film made of a polysilicon material is formed on the exposed surfaces of the semiconductor substrate 1 and the entire surfaces of the insulation film 2, and the resultant structure is patterned for thereby forming a conductive film pattern 3. The conductive film pattern 3 is a lower electrode 3 of the capacitor.

Next, as shown in FIG. 1B, a hemispherical grain (HSG) film 4a is formed on the upper surface of the lower electrode 3. A dielectric film 5 is formed on the upper surface of the HSG film 4a. An upper electrode 6 of the capacitor is formed on the upper surfaces of the dielectric film 5 and the insulation film 2 for thereby completing a fabrication process of the capacitor.

As shown in FIG. 1B, it is difficult to selectively form the HSG film 4a on the upper surface of the lower electrode 3.

Therefore, in order to overcome the above-described problems, a HSG (Hemispherical grain) film is accumulatively formed on the front surface of the resultant structure as shown in FIG. 1A in a known manner. At this time, the insulation film 2 is formed of a material so that the HSG film is well accumulatively formed on the upper surface of the same. In this case, the HSG film is formed on the lower electrode 3 as well as the upper surface of the insulation film 2. However, since the HSG film is not well accumulatively formed on the insulation film 2, the HSG film formed on the upper surface is thinner than the HSG film 4a formed on the upper surface of the lower electrode 3. In addition to that, an electric short may occur between the neighboring lower electrodes 3 due to the HSG film. In order to prevent the above-described electric short, an anisotropical etching operation is performed with respect to the HSG film. At this time, the anisotropical etching operation is performed until the HSG film formed on the insulation film 2 is eliminated for thereby selectively eliminating the HSG film formed on the upper surface of the insulation film 2. However, in this manner, the HSG film formed on the upper surface of the insulation film 2, the HSG film 4a formed on the upper surface of the lower electrode 3 and the lower electrode may be damaged, so that it is difficult to obtain a desired capacitance of the capacitor, and a reproducibility of the product is decreased.

When forming the conductive film as shown in FIG. 1A, since the conductive film is formed even on the upper surface of the insulation film for filling the contact hole and forming the lower electrode of the capacitor, in the case that an aspect ratio of the contact hole is large, the process for filling the contact hole is not easily implemented.

In addition, in the process for forming and patterning the conductive film as shown in FIG. 1A and forming a lower electrode of the capacitor, if the step degree of the contact hole is large, the surface of the conductive film is not uniformly formed. Therefore, when forming a photoresist film on the ununiform conductive film and photo-etching the same, the pattern of the photoresist film is formed uniformly on the portions away from the focusing portions of the light exposing apparatus, so that a reliability of the semiconductor device is decreased because it is difficult to obtain a capacitor lower electrode of a fine pattern.

SUMMARY OF THE INVENTION

Accordingly, it is an object of the present invention to provide a method for fabricating a capacitor for a semiconductor device which overcomes the aforementioned problems encountered in the background art.

It is another object of the present invention to provide a method for fabricating a capacitor for a semiconductor device which is capable of enhancing a reproducibility of the process and a reliability of a semiconductor device by preventing a lower electrode of a capacitor and a HSG film from being damaged.

It is another object of the present invention to provide a method for fabricating a capacitor for a semiconductor device which has a dimple, instead of a HSG film, formed on a lower electrode of a capacitor.

It is another object of the present invention to provide a method for fabricating a capacitor for a semiconductor device which is capable of overcoming a light exposing problem due to a focusing error during a light exposing operation and increasing a reliability of a semiconductor device by performing a planerization process before a process for forming a conductive film and patterning the same is implemented.

To achieve the above objects, there is provided a method for fabricating a capacitor for a semiconductor device according to a first embodiment of the present invention which includes the steps of forming an insulation film having a contact hole on a substrate, forming a hemispherical grain (HSG) film on an inner surface of the contact hole, forming a lower electrode on a surface of the HSG film, removing the insulation film, forming a dimple on a surface of the lower electrode by removing the HSG film, forming a dielectric film on a surface of the lower electrode, and forming an upper electrode on a surface of the dielectric film.

To achieve the above objects, there is provided a method for fabricating a capacitor for a semiconductor device which includes the steps of forming a first insulation film having a first contact hole on a substrate, forming a lower portion of a lower electrode of a first plug, namely, a capacitor, formed of a conductive material in the first contact hole, forming a second insulation film on the first insulation film and the first plug, forming a second contact hole by removing the second insulation film formed in a portion matching with the first plug, forming a hemispherical grain (HSG) film on an inner wall and a bottom portion of the second contact hole, forming an upper portion of the lower electrode of the second plug, namely, the capacitor, on the HSG film, removing the second insulation film, forming a dimple on an outer circumferential surface of the second plug by removing the HSG film, forming a dielectric film on an outer surface of the second plug, and forming an upper electrode on a surface of the dielectric film.

Additional advantages, objects and features of the invention will become more apparent from the description which follows.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

The method for fabricating a capacitor of a semiconductor device according to the present invention will be explained with reference to the accompanying drawings.

Figure 1A:
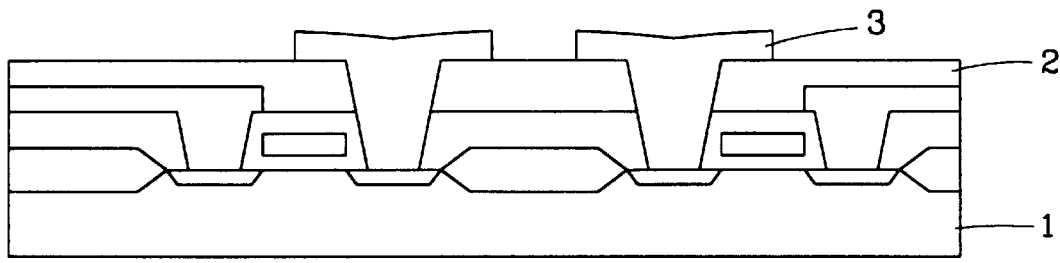
FIGS. 1A through 1C are cross-sectional views illustrating a conventional fabrication method of a capacitor.
Figure 1B:
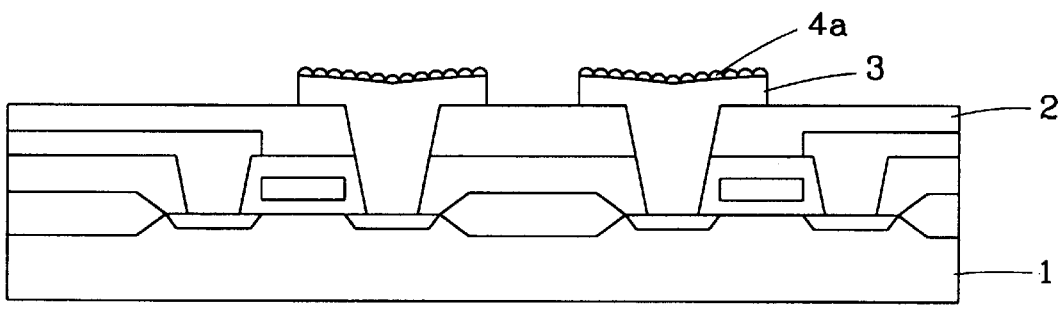
Figure 1C:
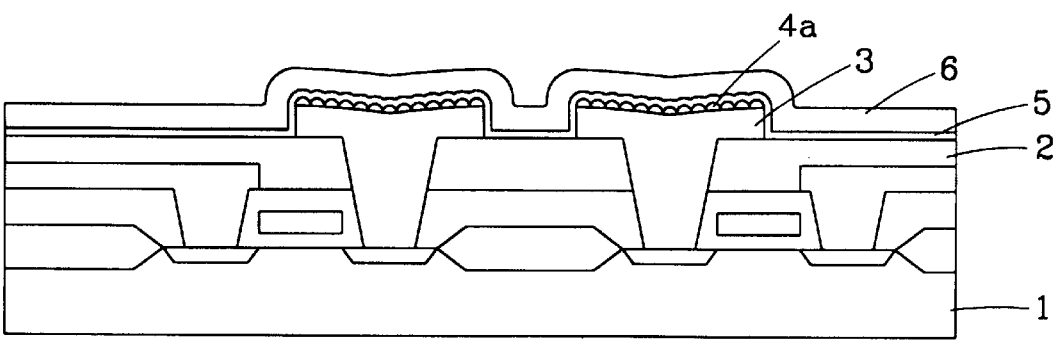
Figure 2A:
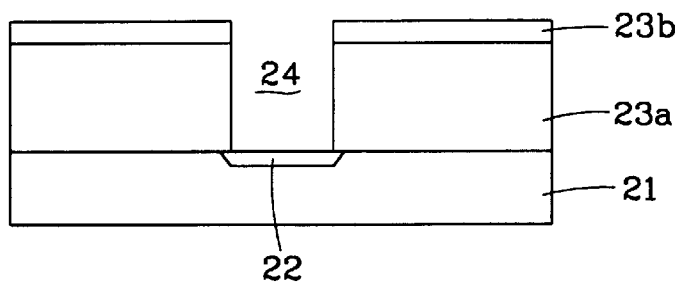
FIGS. 2A through 2H are cross-sectional views illustrating a method for fabricating a capacitor for a semiconductor device according to the present invention.

As shown in FIG. 2A, an oxide film 23a and a nitride film 23b which act as an insulation film are formed on a semiconductor substrate 21 on which a dopant layer 22 is formed, and then the nitride film 23b and the oxide film 23a are selectively etched for thereby forming a first contact hole 24 in order for the surface of the semiconductor substrate 21 to be exposed. The nitride film 23b may be formed of a material having a large etching selection ratio with respect to the material of a lower electrode of the capacitor. Namely, the nitride film may be formed of other material based on the material of the lower electrode of the capacitor. The insulation film formed of the oxide film 23a and the nitride film 23b may be formed of one of the oxide film and the nitride film as a single layer. In the case of the insulation film formed of a single layer, the lower electrode of the capacitor is preferably formed of a material having a large etching selection ratio, namely, an etching speed slower than that of the lower electrode under the same etching condition for the reason that the nitride film 23b is used as an etching stop layer in the next etch-back process.

Figure 2B:
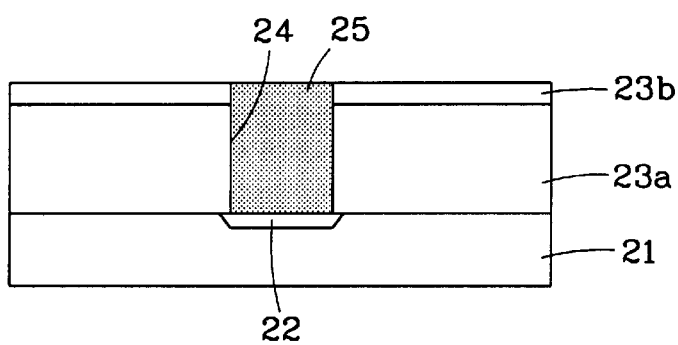

As shown in FIG. 2B, a conductive film (not shown) is formed in the first contact hole 24 and on the upper surface of the nitride film 23b. In the present invention, a doped polysilicon film is used as a conductive film. Thereafter, the conductive film is etched back for thereby leaving the conductive film only in the first contact hole 24 for forming a first plug 25 formed of a conductive material. At the same time, the structure formed on the semiconductor substrate 21 is planerized. The first plug 25 defines a lower portion of the lower electrode of the capacitor.

Here, the etching back process for implementing a planarization of the substrate may be substituted with a chemical-mechanical polishing process.

Figure 2C:
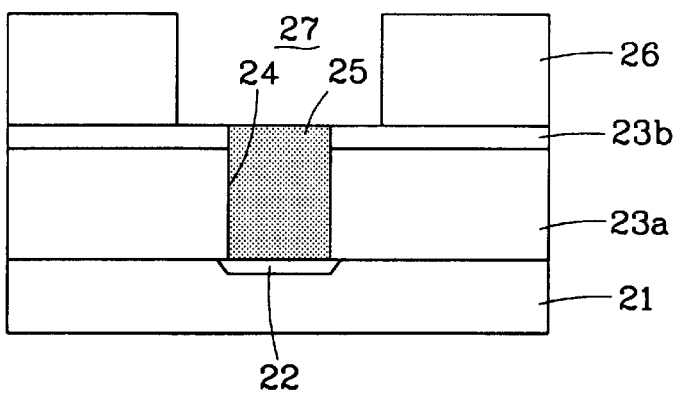

Next, an oxide film 26 is formed on the entire surfaces of the structure shown in FIG. 2B based on a LPCVD. The oxide film 26 is selectively photo-etched, and a second contact hole 27 is formed so that a part of the upper surfaces of the first conductive plug 25 is exposed for thereby implementing the structure as shown in FIG. 2C. At this time, the size of the second contact hole 27 is a key element for defining the surface of the lower electrode of the capacitor.

Figure 2D:
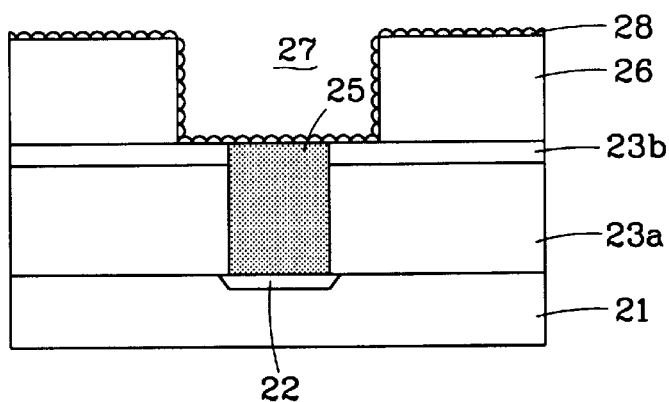

As shown in FIG. 2D, the HSG film 28 is formed on the entire surfaces of the structure shown in FIG. 2C. At this time, the HSG film 28 is formed in the interior of the second contact hole 27, namely, on the inner surface and bottom of the second contact hole 27. The method for forming the HSG film 28 will be explained.

First, an amorphous silicon film is formed on the entire portions of the structure as shown in FIG. 2C to a thickness of about 400 Å. The amorphous silicon film is deposited based on the CVD method at a temperature of 480~530° C. and under a pressure of 1 Torr. Next, the amorphous silicon film is heat-treated in a high vacuum state for thereby obtaining a HSG film 28. The high vacuum heat treatment represents a condition that the amorphous silicon phase is shifted to a crystal silicon phase. Namely, the heat treatment is implemented at a temperature of 580° C.~650° C. and under a vacuum pressure of $1 \times 10^{-7}$ Torr for about 4~6 minutes. At this time, at an initial stage of the heat treatment, a small amount of $SiH_4$ or $Si_2H_6$ gas is supplied into the chamber for thereby forming the crystal silicon film, so that it is possible to shorten the time required for changing the amorphous silicon film to the HSG film. The HSG film is formed of a undoped silicon material having a doping density of 0.

Figure 2E:
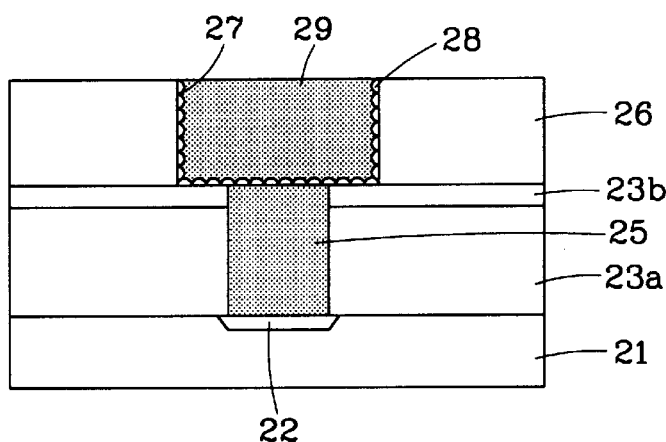

Next, the doped silicon film is formed on the entire structures of FIG. 2D for thereby filling the second contact hole 27 and the resultant structure is etched-back. In addition, as shown in FIG. 2E, a second plug 29 formed of a conductive material is formed in the second contact hole 27. At this time, the HSG film 28 formed on the upper surface of the oxide film 26 is removed. In addition, the second plug 29 is formed of a doped polysilicon, and a doping material, namely, dopant, is P. The doping density is over $1.0 \times 10^{23}$ ea/cm$^3$ compared to the HSG film 28. The second plug corresponds to the upper portion forming the lower electrode of the capacitor. The first plug 25 and the second plug 29 operate as a lower electrode of the capacitor. The oxide film 26 may be substituted with a material having an etching selection ratio larger than the second plug 29. The materials of the oxide film 26 and the second plug 29 may be alternately used. The second plug 29 is preferably formed of a material having an etching speed relatively slower than the HSG film 28.

When fabricating the lower electrode of the capacitor, a contact hole is formed in the lower portion of the lower electrode, and the conductive material is filled therein for thereby forming a plug. The lower portion of the capacitor is formed, and the surface of the substrate is planarization. The upper portion is formed in the same manner as the method for forming the lower portion of the lower electrode. In the conventional art, since the conductive film is formed in the contact hole and on the upper surface of the insulation film, a resultant structure is patterned, and then the lower electrode of the capacitor is formed, the aspect ratio of the contact hole is large, and many problems may occur if the step difference is large. However, in the present invention, the above-described problems occurring due to the step difference are effectively prevented, and the process becomes easier.

Figure 2F:
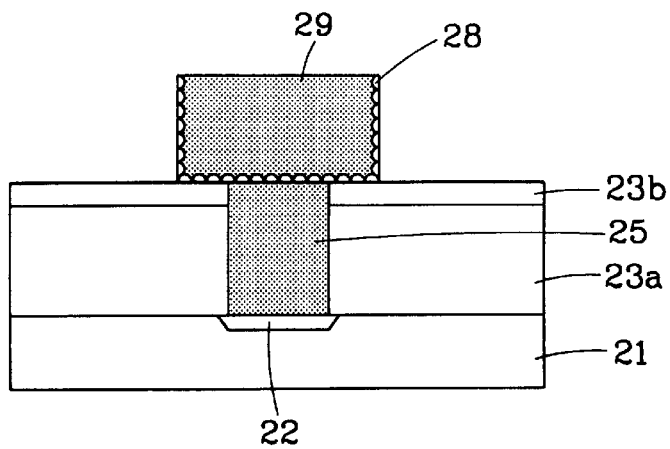

As shown in FIG. 2F, the oxide film 26 is removed based on a wet etching process. As a result, the HSG film 28 is formed on the lateral surface of the second plug 29.

Figure 2G:
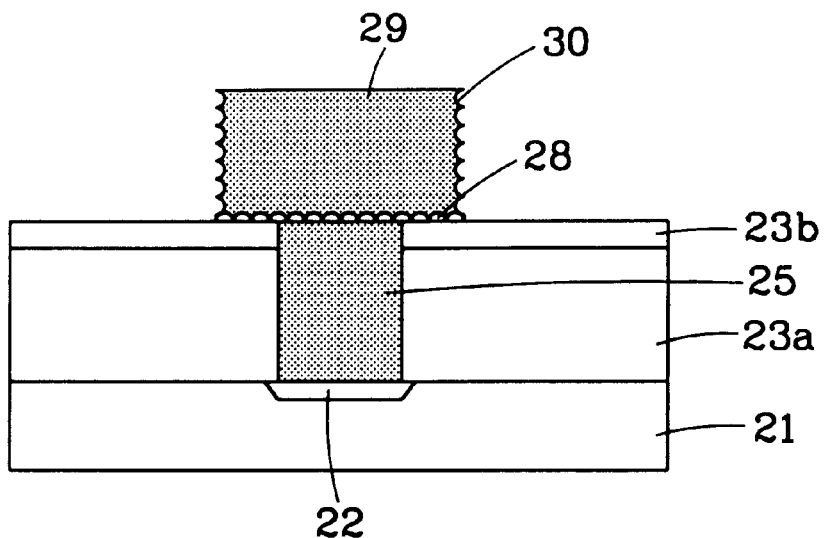
Figure 2H:
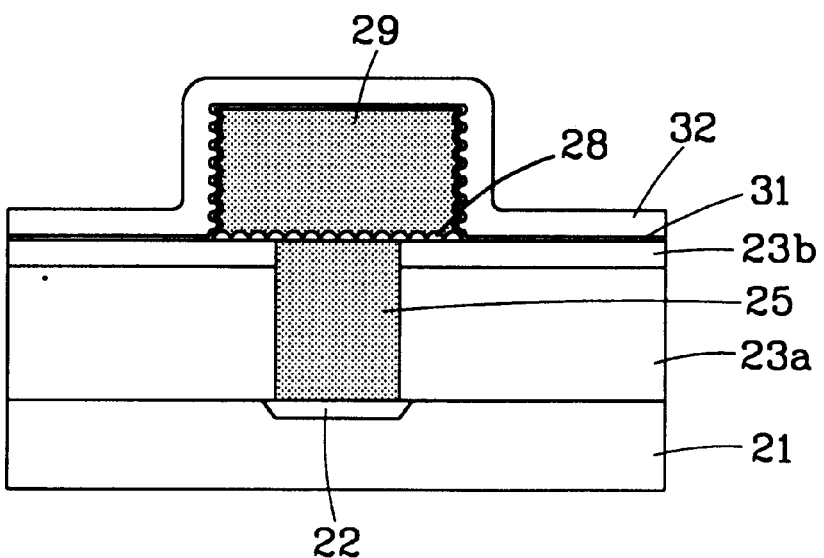

Next, the HSG film 28 is etched and removed. As shown in FIG. 2G, a dimple 30 is formed on the lateral surface of the second plug 29. When etching the HSG film 28, a mixed gas of $SF_6$ of 5 sccm~100 sccm and $N_2$ of 5 sccm~100 sccm is used as an etching gas. At this time, the pressure is 1 mtorr~5 mtorr. In addition, the etching process is performed based on a high density plasma etching process. The second plug 29 is formed of a doped polysilicon, and the HSG film 28 formed on the lateral wall of the second plug 29 is formed of an undoped silicon. The silicon film has a different etching speed based on the doping density. For example, according to the experiment, an etching was performed using P as a dopant under the same conditions as the above-described conditions, the etching speed was decreased by 300 Å/min as the doping density of P was increased by $1.0 \times 10^{23}$ ea/cm$^3$. In the present invention, since the doping density of the second plug 29 is larger than the HSG film 28 by more than $1.0 \times 10^{23}$ ea/cm$^3$, the etching speed of the second plug 29 is slower than the etching speed of the HSG film 28 by more than 300 Å/min. Since the HSG film 28 has an etching selection ratio larger than the second plug 29, the second plug 29 is not damaged, so that it is possible to selectively remove the HSG film 28 based on the above-described process. Therefore, a dimple 30 is formed on the lateral wall of the second plug 29 by removing the HSG film 28.

Next, a dielectric film 31 is formed on the entire surfaces of the structure as shown in FIG. 2G. The dielectric film 31 is preferably formed of a tantalum oxide film ($Ta_2O_5$) or a nitride film (NO). In the case that the dielectric film is a nitride film, the dielectric film is preferably formed to a thickness of about 50~100 Å. In addition, in the case that the dielectric film is a tantalum oxide film, the dielectric film is formed to a thickness of about 50~300 Å. In this case, the thickness of the same is thicker than that of the nitride film, however it is possible to obtain a dielectric ratio higher than the nitride film.

Next, the conductive film 32 is formed on the surface of the dielectric film 31 for thereby forming the upper electrode of the capacitor, so that the fabrication of the capacitor is completed. The conductive film 32 is formed of a tungsten (W), a titanium nitride (TiN), a tungsten nitride (WN), etc. The above-described conductive film may be formed based on the CVD process.

In the present invention, the first plug is formed in the first contact hole, and then the surfaces of the semiconductor is planerized. Thereafter, the second contact hole is formed in the portion in which the contact hole is formed for thereby forming the second plug, so that the lower electrode of the capacitor is formed. Therefore, even though the aspect ratio of the contact hole is large, it is easy to fill a conductive material in the contact hole. In addition, during the patterning process of the lower electrode for forming the lower electrode, since the photo etching process is performed with respect to the planarization surfaces of the substrate, it is possible to easily fabricate the lower electrode. Since the step coating characteristic is good, a reliability of the semiconductor fabricated according to the present invention is enhanced. In the present invention, after the HSG film is formed, the same is removed at one time for thereby forming the dimple and increasing the actual area of the capacitor. Since there is a big difference between the etching speeds of the HSG film and the second plug when removing the HSG film, the lower electrode of the second plug, namely, the capacitor, is not damaged, so that a reproducibility of the process is increased, and a reliability of the semiconductor device is enhanced.

Although the preferred embodiment of the present invention have been disclosed for illustrative purposes, those skilled in the art will appreciate that various modifications, additions and substitutions are possible, without departing from the scope and spirit of the invention as recited in the accompanying claims.

What is claimed is:

1. A method for fabricating a capacitor for a semiconductor device, comprising;
    forming an insulation film having a contact hole on a substrate;
    forming a hemispherical grain (HSG) film on an inner surface of the contact hole;
    forming a lower electrode on a surface of the HSG film formed on the inner surface of the contact hole, the lower electrode being formed such that it fills the contact hole to create a substantially cylindrical shape;
    removing the insulation film;
    forming a dimpled surface of the lower electrode by removing the HSG film positioned on a circumferential surface of the substantially cylindrical lower electrode;
    forming a dielectric film on a surface of the lower electrode; and
    forming an upper electrode on a surface of the dielectric film.

2. A method for fabricating a capacitor for a semiconductor device, comprising:
    forming a first insulation film having a first contact hole on a substrate;
    forming a lower portion of a first electrode of a capacitor by depositing conductive material in the first contact hole;
    forming a second insulation film on the first insulation film and the lower portion of the first electrode;
    forming a second contact hole by removing the second insulation film formed in a portion matching with the lower portion of the first electrode;
    forming a hemispherical grain (HSG) film on an inner wall and a bottom portion of the second contact hole;
    forming an upper portion of the first electrode of the capacitor on the HSG film by filling the second contact hole with conductive material;

removing the second insulation film;

forming a dimpled outer circumferential surface of the upper portion of the first electrode by removing the HSG film;

forming a dielectric film on an outer surface of the upper portion of the first electrode; and forming a second electrode on a surface of the dielectric film.

3. The method of claim 2, wherein said first insulation film is formed of a double layer of an oxide film and a nitride film.

4. The method of claim 2, wherein said first insulation film is formed of a material having a high etching selection ratio with respect to a material of the lower portion of the first electrode.

5. The method of claim 2, wherein forming the lower portion of the first electrode comprises:

forming a conductive film on the entire structure obtained after forming the first contact hole; and etching-back the conductive film.

6. The method of claim 5, wherein said etching-back step is performed using a chemical-mechanical polishing process.

7. The method of claim 2, wherein said second insulation film is an oxide film grown by a low temperature chemical vapor deposition process.

8. The method of claim 2, wherein said second insulation film is formed of a material having a high etching selection ratio with respect to a material of the upper portion of the first electrode.

9. The method of claim 2, wherein said step for forming the HSG film comprises:

forming an amorphous silicon film on an inner wall and a bottom portion of the second contact hole; and heat-treating the amorphous silicon film and changing the heat-treated amorphous silicon film to the HSG film.

10. The method of claim 9, wherein the amorphous silicon film is formed using a deposition process performed at a temperature 480~530° C. and under a pressure of below 1 Torr, and the amorphous silicon film is changed to the HSG film at a temperature 580~650° C. and under a pressure of below $1\times10^{-7}$ for 4~6 minutes.

11. The method of claim 10, wherein $SiH_4$ or $Si_2H_6$ is added at an initial stage of the step for changing the amorphous silicon film to the HSG film.

12. The method of claim 2, wherein said HSG film is formed of a undoped silicon.

13. The method of claim 2, wherein said lower portion of the first electrode and said upper portion of the first electrode are formed of a doped polysilicon.

14. The method of claim 13, wherein said dopant for the upper portion of the first electrode is Phosphorus (P).

15. The method of claim 2, wherein said dielectric film is formed of $Ta_2O_5$ or NO.

16. The method of claim 15, wherein said dielectric film is formed to a thickness of 50~300 Å when said dielectric film is formed of $Ta_2O_5$.

17. The method of claim 15, wherein said dielectric film is formed to a thickness of 50~100 Å when said dielectric film is formed of NO.

18. The method of claim 2, wherein said second electrode is formed of a tungsten, a titanium nitride, or a tungsten nitride.

19. The method of claim 1, wherein said first insulation film is formed of a double layer of an oxide film and a nitride film.

20. The method of claim 1, wherein removing the HSG film is performed using a high density plasma etching process in which a mixed gas of $SF_6$ of 5 sccm~100 sccm is used as an etchant under a pressure of 1 mtorr~5 mtorr.

* * * * *